United States Patent [19]

Archer

[11] Patent Number: 5,764,101

[45] Date of Patent: Jun. 9, 1998

[54] RAIL-TO-RAIL INPUT COMMON MODE RANGE DIFFERENTIAL AMPLIFIER THAT OPERATES WITH VERY LOW RAIL-TO-RAIL VOLTAGES

[75] Inventor: Donald M. Archer, Santa Clara, Calif.

[73] Assignee: National Semiconductor Corporation, Santa Clara, Calif.

[21] Appl. No.: 855,156

[22] Filed: May 13, 1997

Related U.S. Application Data

[63] Continuation of Ser. No. 518,485, Aug. 23, 1995, abandoned.

[51] Int. Cl.$^6$ ........................................................ H03F 3/45
[52] U.S. Cl. ........................ 330/253; 330/258; 330/311
[58] Field of Search .................................. 330/252, 253, 330/258, 311

[56] References Cited

U.S. PATENT DOCUMENTS

| | | | |
|---|---|---|---|
| 4,555,673 | 11/1985 | Huijsing et al. | 330/258 |
| 4,728,900 | 3/1988 | Nakagawara et al. | 330/253 |
| 4,794,349 | 12/1988 | Senderowicz et al. | 330/253 |
| 5,006,817 | 4/1991 | Babanezhad | 330/253 |
| 5,294,893 | 3/1994 | Ryat | 330/258 |
| 5,334,948 | 8/1994 | Fong et al. | 330/253 |
| 5,337,007 | 8/1994 | Barrett, Jr. et al. | 330/253 |
| 5,337,008 | 8/1994 | Badyal | 330/253 |
| 5,371,474 | 12/1994 | Wassenaar et al. | 330/253 |
| 5,491,455 | 2/1996 | Kuo | 330/253 |

*Primary Examiner*—James B. Mullins
*Attorney, Agent, or Firm*—Limbach & Limbach L.L.P.

[57] ABSTRACT

A rail-to-rail input common mode range differential amplifier operates on rail-to-rail voltages down to approximately one volt by utilizing one p-channel transistor to cover a first portion of the common mode range, and a second p-channel transistor to cover a second portion of the common mode range.

2 Claims, 4 Drawing Sheets

RAIL-TO-RAIL INPUT COMMON MODE RANGE DIFFERENTIAL AMPLIFIER THAT OPERATES WITH VERY LOW RAIL-TO-RAIL VOLTAGES

This is a continuation of application No. 08/518,485 filed on Aug. 23, 1995, now abandoned.

BACKGROUND OF THE INVENTION

1. Field of the Invention

The present invention relates to a rail-to-rail input common mode range differential amplifier and, more particularly, to a rail-to-rail input common mode range differential amplifier that operates with very low supply voltages.

2. Description of the Related Art

A rail-to-rail input common mode range differential amplifier is an amplifier that can operate on a range of dc voltages that are defined by the rail-to-rail voltages.

FIG. 1 shows an example of a conventional rail-to-rail input common mode range differential amplifier 10. As shown in FIG. 1, amplifier 10 includes a current source 12 that outputs a tail current $I_T$. In addition, amplifier 10 includes a differential pair 14 that outputs first and second intermediate currents $I_{M1}$ and $I_{M2}$, and varies the magnitude of the first and second intermediate currents $I_{M1}$ and $I_{M2}$ in response to the voltage difference between the differential inputs $V_{IN}+$ and $V_{IN}-$. Further, amplifier 10 also includes a load 16.

To operate rail-to-rail, differential pair 14 is implemented with a pair of p-channel depletion-type transistors M1 and M2 which each have a threshold voltage of approximately 0.5 volts. (For this example it is assumed that transistors M1 and M2 operate with $V_{GS}-V_T=0$, and that $V_T=V_{GS}$ for transistors M1 and M2). As is well known, by forming a p-channel depletion-type device with a threshold voltage of approximately 0.5 volts, the voltage on the gate can rise above the voltage on the source by approximately the same amount.

In operation, current source 12 requires a minimum voltage drop of approximately 0.2 volts to stay in the saturation region and insure that the tail current $I_T$ remains relatively constant. Thus, when the voltages on the gates of transistors M1 and M2 rise towards the upper rail, the voltages on the sources also rise until the voltages on the sources are approximately 0.2 volts less than the voltage on the upper rail.

Since the voltage on the gate can rise approximately 0.5 volts above the voltage on the source, the voltage on the gate can rise approximately 0.3 volts above the voltage on the upper rail. Any further increase in the gate voltage causes the source to rise further, thereby forcing transistor M44 into the triode region of operation.

To hit the lower rail, however, transistors M1 and M2 must take advantage of the so-called "body effect". As shown in FIG. 1, the bodies of transistors M1 and M2 are connected to the upper rail. Thus, for example, when the voltage on the gate of transistor M1 is approximately 0.3 volts above the voltage on the upper rail, the source-to-body voltage is approximately 0.2 volts below the upper rail.

As the voltage on the gate moves towards the lower rail, the voltage on the source moves in a non-linear fashion towards the lower rail. As a result, a larger and larger negative voltage is impressed across the source-to-body junction.

The net result of this change in the source-to-body voltage is that the threshold voltage becomes more negative. When the rail-to-rail voltage swing is approximately three volts, the threshold voltage of transistors M1 and M2 will be effectively changed from approximately 0.5 volts when $V_{IN}+$ and $V_{IN}-$ are at the upper rail to approximately −0.5 volts when $V_{IN}+$ and $V_{IN}-$ are at the lower rail.

As a result of this change, the gate-to-source voltage of transistor M1, for example, becomes progressively more negative as the gate voltage moves towards the lower rail. Thus, when the voltages on the gates of transistors M1 and M2 are equal to the voltage on the lower rail, the voltages on the sources will be approximately 0.5 volts greater than the voltages on the gates. The resulting voltage drops across transistor M1 and transistors M4 and M5, which constitute load 16, are sufficient to insure that transistors M1 and M2 remain in the saturation region.

One problem with utilizing p-channel depletion-type transistors M1 and M2, however, is that as the rail-to-rail voltage is reduced, the effective change in the threshold voltage due to the body effect becomes less and less. Thus, for example, where the threshold voltage effectively drops from 0.5 volts to −0.5 volts for a rail-to-rail voltage of three volts, the effective change for a rail-to-rail voltage of one volt may only be from 0.5 volts to 0.1 volts.

This, in turn, reduces the source-to-drain voltage drops across transistors M1 and M2 to the point where transistors M1 and M2 either enter the triode region of operation or turn off completely. Thus, there is a need for a rail-to-rail input common mode range differential amplifier that operates with very low rail-to-rail voltages.

SUMMARY OF THE INVENTION

In the present invention, a rail-to-rail input common mode range differential amplifier operates on rail-to-rail voltages down to approximately one volt by utilizing one p-channel transistor to cover a first portion of the common mode range, and a second p-channel transistor to cover a second portion of the common mode range.

A rail-to-rail input common mode range differential amplifier for amplifying a voltage difference between a pair of differential inputs includes a current source stage that outputs first and second tail currents. The first and second tail currents, in turn, are received by a differential pair stage that outputs first and second intermediate currents, and varies the magnitude of the first and second intermediate currents in response to the voltage difference between the differential inputs.

A better understanding of the features and advantages of the present invention will be obtained by reference to the following detailed description and accompanying drawings which set forth an illustrative embodiment in which the principals of the invention are utilized.

DETAILED DESCRIPTION

Figure 1:
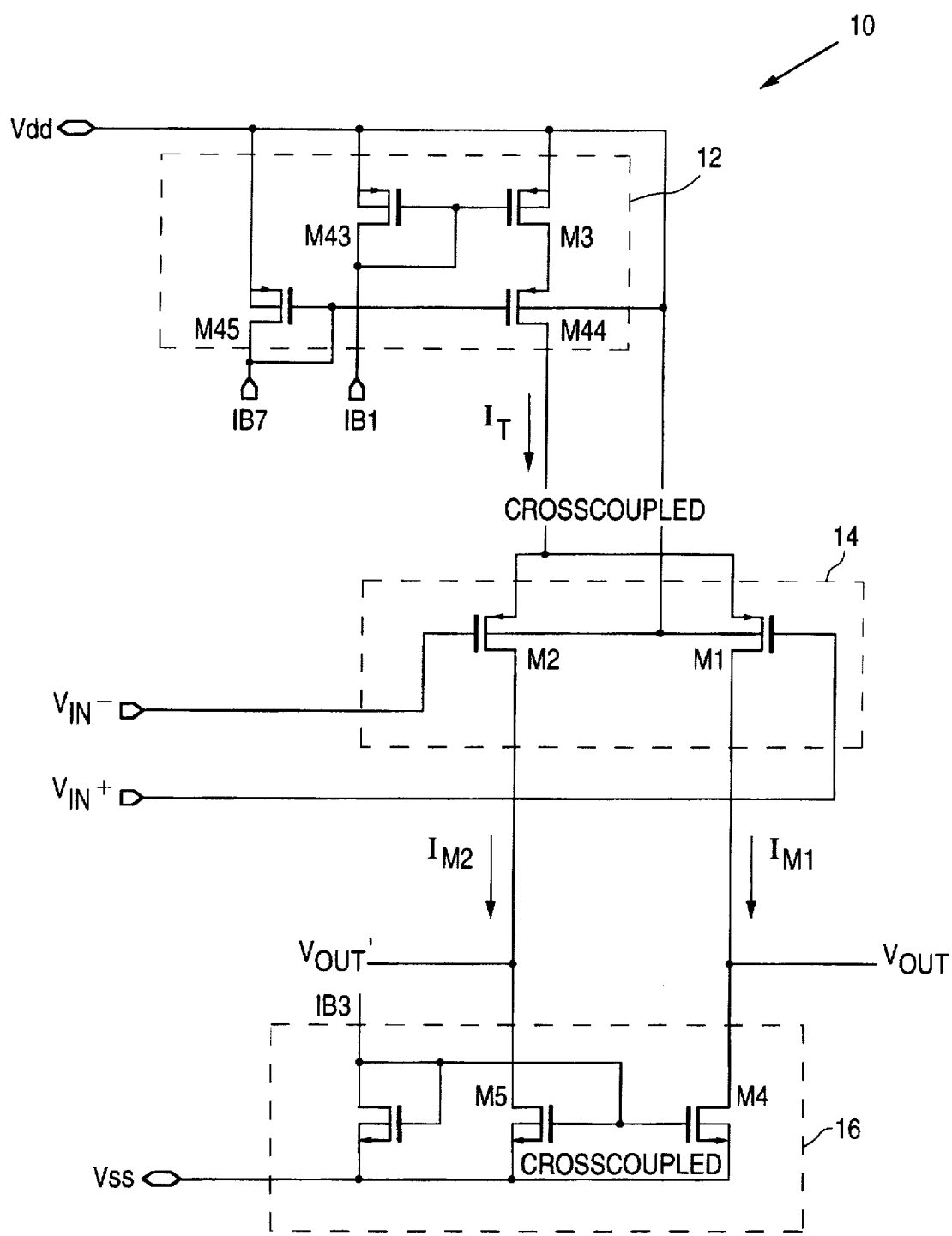
FIG. 1 is a schematic diagram illustrating a conventional rail-to-rail input common mode range differential amplifier 10.
Figure 2:
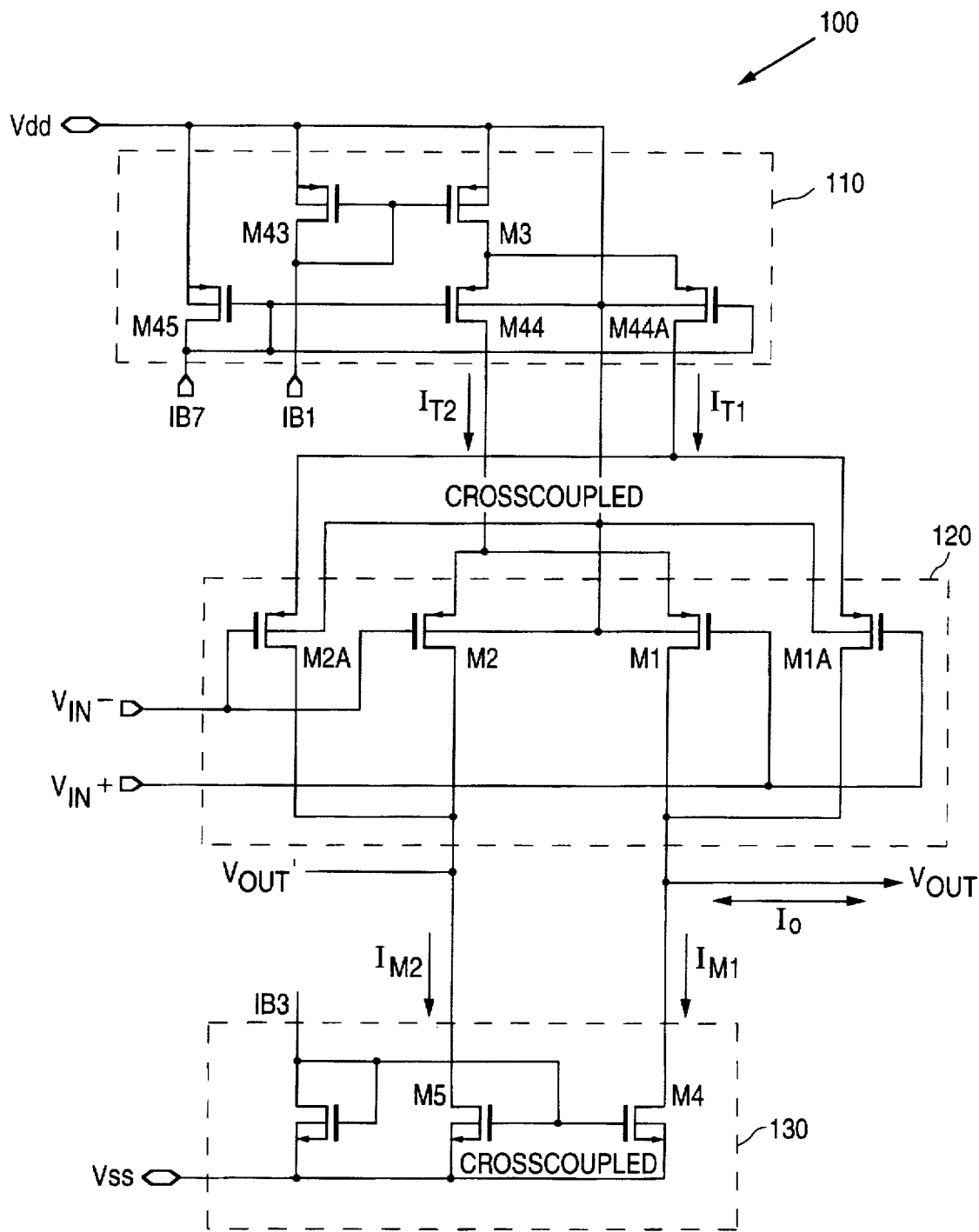
FIG. 2 is a schematic diagram illustrating a rail-to-rail input common mode range differential amplifier 100 in accordance with the present invention.

FIG. 2 shows a schematic diagram of a rail-to-rail input common mode range differential amplifier 100 in accordance with the present invention. As described in greater detail below, amplifier 100 operates on very low rail-to-rail voltages by utilizing a first p-channel differential pair to cover the upper portion of the input common mode range, and a second p-channel differential pair to cover the remainder of the range.

As shown in FIG. 2, amplifier 100 includes a current source stage 110 that outputs a pair of tail currents $I_{T1}$ and $I_{T2}$, and a differential pair stage 120 that outputs first and second intermediate currents $I_{M1}$ and $I_{M2}$, and varies the magnitude of the first and second intermediate currents $I_{M1}$ and $I_{M2}$ in response to the voltage difference between the differential inputs $V_{IN}+$ and $V_{IN}-$.

Amplifier 100 also includes an active load stage 130 that amplifies the difference in magnitude between the first and second intermediate currents $I_{M1}$ and $I_{M2}$. The amplified current difference, in turn, causes an output current $I_O$ to be sourced out of or sunk in from node $V_{OUT}$, thereby causing the voltage at node $V_{OUT}$ to rise or fall, respectively. Alternately, a passive load can be used in lieu of active load stage 130.

To operate rail-to-rail, differential pair stage 120 is implemented with a pair of p-channel depletion-type transistors M1 and M2, and a pair of p-channel enhancement-type transistors M1A and M2A. In the preferred embodiment, transistors M1 and M2 are formed with a threshold voltage of approximately 0.5 volts (assuming that $V_{GS}-V_T=0$, then $V_{GS}=0.5$ V), while transistors M1A and M2A are formed with a threshold voltage of approximately −0.7 volts (assuming that $V_{GS}-V_T=0$, then $V_{GS}=-0.7$ V).

Although the rail-to-rail common mode range of amplifier 100 can accommodate a variety of voltages, the following discussion of the operation of amplifier 100 is based on a rail-to-rail common mode range of one volt. In addition, the discussion assumes that the differential pairs M1/M2 and M1A/M2A are operating in the subthreshold region, while the current mirrors are not. Alternately, however, the differential pairs M1/M2 and M1A/M2A can operate in strong inversion, and the current mirrors can operate in the subthreshold region.

In operation, current source stage 110 requires a minimum voltage drop of approximately 0.2 volts to insure that transistor M3 remains in the saturation region. Thus, as the voltages on the gates of transistors M1 and M2 rise towards the upper rail, the voltages on the sources will also rise until the voltages on the sources are approximately 0.2 volts less than the voltage on the upper rail. Any further increase in the gate voltage will pull up the source voltage which, in turn, will force transistor M44 to either operate in the triode region or turn off.

With p-channel depletion-type devices, the voltage on the gate can rise above the voltage on the source by the threshold voltage. Thus, in the present example, the voltage on the gate can rise approximately 0.5 volts above the voltage on the source which, in turn, allows the voltage on the gate to rise approximately 0.3 volts above the voltage on the upper rail.

Active load 130 also requires a minimum voltage drop of approximately 0.2 volts across the drain-to-source of transistors M4 and M5 to insure that transistors M4 and M5 remain saturated. Alternately, other minimum voltages can be used as long as transistors M4 and M5 remain in saturation. In addition, transistors M1 and M2 require a minimum source-to-drain voltage of 0.1 volts or less to insure that these transistors remain saturated.

Thus, as the voltages on the gates of transistors M1 and M2 fall towards the lower rail, the voltages on the sources will also fall until the voltages on the sources are approximately 0.4 volts greater than the voltage on the lower rail. Any further decrease in the gate voltages will pull down the source voltages which, in turn, will force transistors M1 and M2 to either operate in the triode region or turn off.

When the voltage on the source is approximately 0.4 volts greater than the lower rail, the gate-to-source voltage is determined by the voltage across the source-to-body junction. As shown in FIG. 2, when the body is connected to the upper rail, the threshold voltage becomes more negative as the gate voltage swings towards the lower rail as a result of the so-called "body effect".

As described above, however, the magnitude of the threshold voltage change is a function of the rail-to-rail voltage. Thus, while the threshold voltage will change from 0.5 volts to approximately −0.5 volts with a three volt rail-to-rail swing, the threshold voltage will only change from 0.5 volts to approximately 0.1 volts with a one volt rail-to-rail swing.

Thus, by taking advantage of the body effect, the gate voltage can fall to approximately 0.3 volts above the lower rail. On the other hand, when the body is shorted to the source, the threshold voltage remains constant as the gate voltage swings towards the lower rail. Thus, when the source-to-body voltage is zero, the gate voltage can only fall to approximately 0.8 volts above the lower rail without collapsing transistors M1 and M2.

In accordance with the present invention, the remaining input common mode range is covered by p-channel enhancement-type transistors M1A and M2A. By utilizing p-channel enhancement-type devices, the voltage on the gate can fall below the voltage on the source by the threshold voltage when $V_{GS}-V_T=0$. Thus, since the threshold voltages of transistors M1A and M2A are −0.7 volts in the present example, the voltages on the gates can fall approximately 0.7 volts below the voltage on the source.

As with transistors M1 and M2, transistors M1A and M2A also require a minimum source-to-drain voltage of 0.1 volts or less to insure that these transistors remain saturated.

Thus, as the voltages on the gates of transistors M1/M2 and M1A/M2A fall towards the lower rail, transistors M1 and M2 turn off first, while transistors M1A and M2A turn off when the voltages on the sources of transistors M1A and M2A fall to a voltage which is approximately 0.2 volts greater than the voltage on the lower rail. Any further decrease in the gate voltage will pull down the source voltage which, in turn, will force transistors M1A and M2A to either operate in the triode region or turn off.

As with transistors M1 and M2, when the voltage on the sources of transistors M1A and M2A are approximately 0.4 volts greater than the lower rail, the voltages on the gates are also determined by the voltage across the source-to-body junction. Thus, as shown in FIG. 2, when the body is connected to the upper rail, the threshold voltage will effectively change from −0.7 volts to approximately −1.1 volts as the voltage swings from the upper rail to the lower rail.

Thus, by taking advantage of the body effect, the gate voltage can fall to approximately 0.7 volts below the lower rail. On the other hand, when the body is shorted to the source, the threshold voltage remains constant as the gate voltage swings towards the lower rail. Thus, when the source-to-body voltage is zero, the gate voltage can only fall to approximately 0.3 volts below the lower rail without collapsing transistors M1A and M2A.

With respect to the upper rail, the sources of transistors M1A and M2A can only rise to approximately 0.2 volts below the upper rail without forcing transistor M44 to either enter the triode region of operation or turn off. Thus, when the sources of transistors M1A and M2A are approximately 0.2 volts below the upper rail, the gates will be more than 0.9 volts below the upper rail due to the body-effect.

It is noted that if the differential pairs M1/M2 and M1A/M2A are operated in strong saturation, then the $g_m$ of the differential pairs M1/M2 and M1A/M2A will not remain constant. Thus, additional circuitry would be necessary to deal with the tail currents.

Referring again to FIG. 2, current source stage 110 is implemented with a p-channel enhancement-type transistor M3 that outputs a constant current, and a pair of p-channel enhancement-type cascode transistors M44 and M44A that steer the current output by transistor M3.

In operation, as the gate voltages on transistors M1 and M2 fall below approximately 0.1 volts above the lower rail, transistors M1 and M2 begin to collapse due to the smaller drain-to-source voltages. This, in turn, turns off transistor M44. As a result, transistors M1A and M2A source all of the current output by transistors M3 and M44A.

Similarly, as the gate voltages on transistors M1A and M2A rise above approximately 0.1 volts above the lower rail, transistors M1A and M2A begin to collapse. This, in turn, turns off transistor M44A. As a result, transistors M1 and M2 source all of the current output by transistors M3 and M44.

Alternately, although not the preferred embodiment, a current source that outputs a single tail current can be used in lieu of the two tail currents $I_{T1}$ and $I_{T2}$ output by current source stage 110. This alternate current source can be implemented by utilizing, for example, only transistor M3, or by using transistors M3 and M44 in a cascode arrangement.

Figure 3:
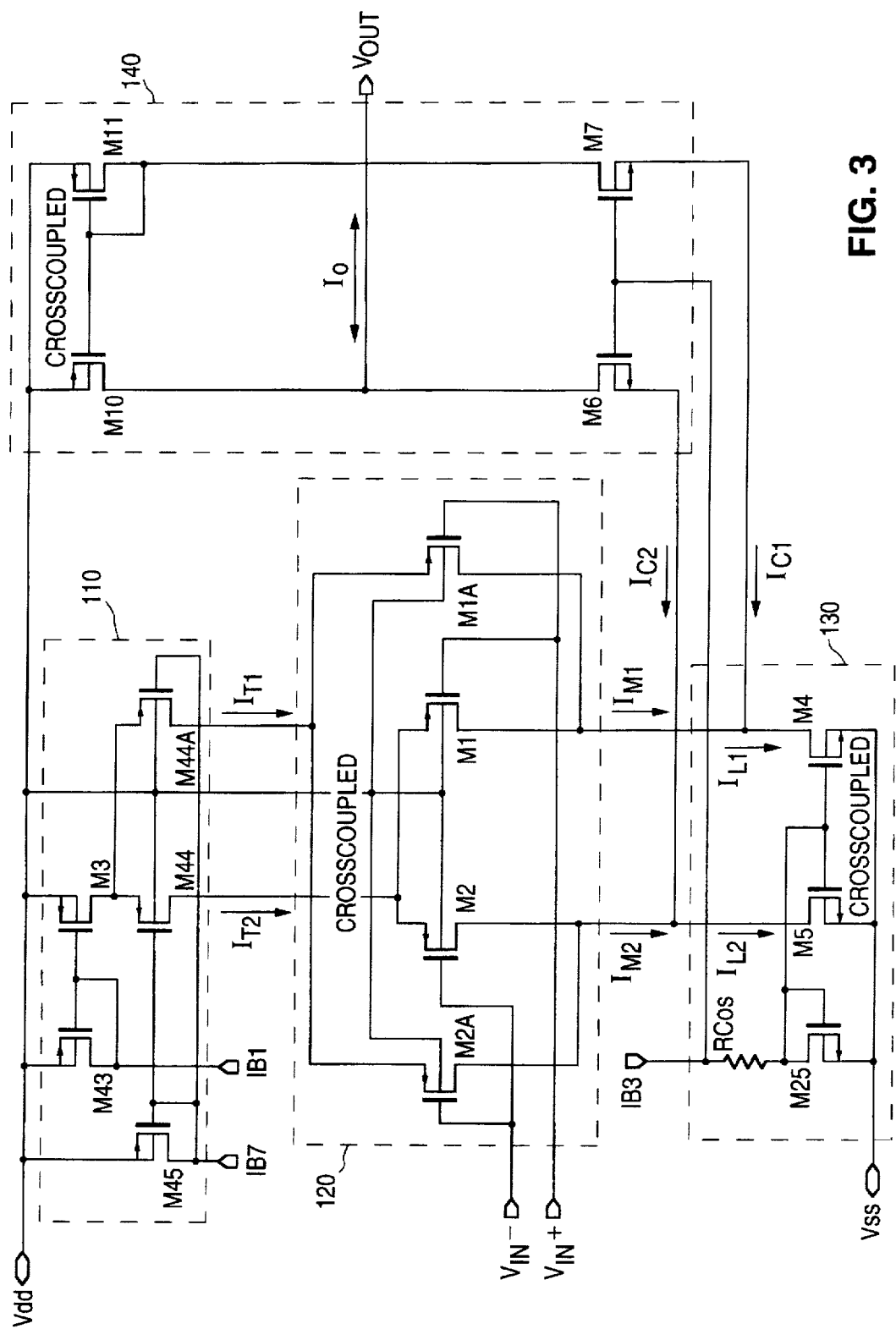
FIG. 3 is a schematic diagram illustrating rail-to-rail input common mode range differential amplifier 100 with a folded cascode stage 140.

In addition to the above, the output impedance of amplifier 100 can be increased by utilizing a folded cascode stage. As shown in FIG. 3, a folded cascode stage 140 outputs first and second cascode currents $I_{C1}$ and $I_{C2}$ which are summed with first and second intermediate currents $I_{M1}$ and $I_{M2}$, respectively, to form first and second load currents $I_{L1}$ and $I_{L2}$, respectively. The first and second load currents $I_{L1}$ and $I_{L2}$, in turn, are sunk by transistors M4 and M5, respectively, of active load stage 130. In addition, folded cascode stage 140 also outputs an output current $I_O$.

In operation, folded cascode stage 140 varies the magnitude of the first and second cascode currents $I_{C1}$ and $I_{C2}$ in response to changes in the magnitude of the first and second intermediate currents $I_{M1}$ and $I_{M2}$ and varies the magnitude and sign of the output current $I_O$ in response to changes in the magnitude of the first and second cascode currents $I_{C1}$ and $I_{C2}$.

For example, when no offset current is present and the differential inputs $V_{IN}+$ and $V_{IN}-$ are both equal, the magnitudes of the intermediate currents $I_{M1}$ and $I_{M2}$ are equal, the magnitudes of the cascode currents $I_{C1}$ and $I_{C2}$ are equal, and the magnitudes of the load currents $I_{L1}$ and $I_{L2}$ are equal. As a result, the magnitude of the output current $I_O$ is approximately zero.

As the differential input $V_{IN}+$ moves toward the lower rail and input $V_{IN}-$ moves toward the upper rail, the magnitude of the first intermediate current $I_{M1}$ increases while the magnitude of the second intermediate current $I_{M2}$ decreases. The increased first intermediate current $I_{M1}$, in turn, reduces the magnitude of the first cascode current $I_{C1}$.

The first cascode current $I_{C1}$ then reduces the magnitude of the second cascode current $I_{C2}$ due to the operation of the current mirror formed from transistors M10 and M11. Since both the second intermediate current $I_{M2}$ and the second cascode current $I_{C2}$ have been reduced, cascode stage sinks the output current $I_O$, thereby lowering the voltage at node Vout, to satisfy the current requirements of transistor M5.

Figure 4:
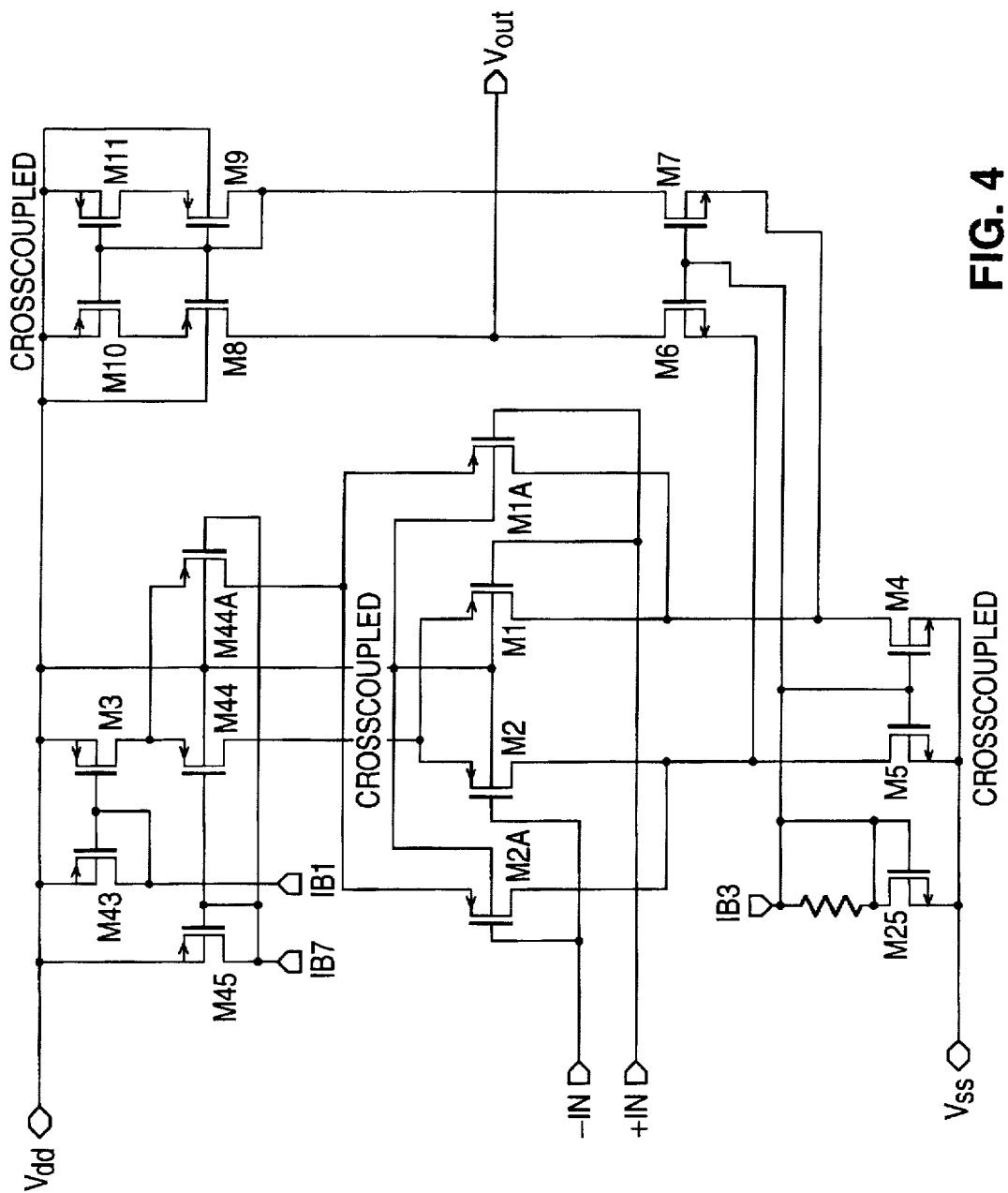
FIG. 4 is a schematic diagram illustrating rail-to-rail input common mode range differential amplifier 100 with folded cascode stage 140 and a balanced biasing circuit.

FIG. 4 shows a schematic diagram illustrating rail-to-rail input common mode range differential amplifier with an enhanced folded cascode stage. As shown in FIG. 4, the impedance of the current mirror formed by transistors M10 and M11 can be increased by adding transistors M8 and M9.

In addition to providing a rail-to-rail input common mode range differential amplifier that operates with very low rail-to-rail voltages, the present invention also provides the advantage of only requiring one set of loads, which reduces noise, and one channel type of transistor, which simplifies the layout.

In the present invention, the only items which are doubled up is the differential pair transistors and the tail source cascode. Since both transistor sets are p-channel, the transistors can be laid out as one and simply separated. The two transistor sets can be easily interdigitated such that the offset between the two can be minimized. Since these examples have assumed $V_{GS}-V_T=0$, the change in $G_M$ as the common mode voltage is changed will be minimal.

It should be understood that various alternatives to the embodiment of the invention described herein may be employed in practicing the invention. For example, although the operation of the present invention has been described with respect to specific threshold voltages, other threshold voltages may alternately be used.

In addition, rather than using depletion-type and enhancement-type transistors in the differential pair, an enhancement-type transistor and a stronger enhancement-type transistor can alternately be used as long as a sufficient offset is provided. Further, the present invention could also be implemented with inverted transistor types, i.e., n-channel differential pairs, and rail-to-rail voltages.

Thus, it is intended that the following claims define the scope of the invention and that methods and structures within the scope of these claims and their equivalents be covered thereby.

What is claimed is:

1. A rail-to-rail input common mode range differential amplifier for amplifying a voltage difference between a pair of differential inputs, the amplifier comprising:

a current source stage that outputs first and second tail currents; and a differential pair stage that receives the first and second tail currents, outputs first and second intermediate currents, and varies the magnitude of the first and second intermediate currents in response to the voltage difference between the differential inputs; and wherein the differential pair stage includes a first pair of p-channel transistors connected to the current source stage to receive the first tail current, and to the pair of differential inputs such that a first transistor of the first pair of transistors is connected to the first differential input and a second transistor of the first pair of transistors is connected to the second differential input, the first pair of transistors outputting the first and second intermediate currents when the voltages on the first and second differential inputs are in a first voltage range; and wherein the differential pair stage includes a second pair of p-channel transistors connected to the current source stage to receive the second tail current, and to the pair of differential inputs such that a first transistor of the second pair of transistors is connected to the first differential input and a second transistor of the second pair of transistors is connected to the second differential input, the second pair of transistors outputting the first and second intermediate currents when the voltages on the first and second differential inputs are in a second voltage range; and wherein the first pair of transistors include depletion-type MOS transistors wherein the second pair of transistors include enhancement-type MOS transistors.

2. The amplifier of claim 1 wherein the depletion-type MOS transistors include a body that is electrically connected to an upper rail voltage.

* * * * *